United States Patent [19]

Yoshizawa et al.

[11] Patent Number: 4,800,338

[45] Date of Patent: Jan. 24, 1989

[54] PULSE COUNT TYPE FM DEMODULATOR

[75] Inventors: Shigeo Yoshizawa; Eiichi Ishii, both of Tokyo, Japan

[73] Assignee: NEC Corporation, Tokyo, Japan

[21] Appl. No.: 67,179

[22] Filed: Jun. 29, 1987

[30] Foreign Application Priority Data

Jun. 28, 1986 [JP] Japan ................................. 61-150662

[51] Int. Cl.$^4$ ........................ H03D 3/04; H03K 9/06
[52] U.S. Cl. ................................... 329/103; 329/107; 329/123; 329/126; 329/145
[58] Field of Search ............... 329/103, 110, 123, 126, 329/127, 128, 137, 145, 107; 455/214, 337

[56] References Cited

U.S. PATENT DOCUMENTS 3,491,305  1/1970  Stone .................................. 329/126
3,502,995  3/1970  Cottatellucci et al. .............. 329/126

Primary Examiner—Siegfried H. Grimm
Attorney, Agent, or Firm—Sughrue, Mion, Zinn, Macpeak & Seas

[57] ABSTRACT

An FM demodulator having improved demodulation sensitivity, and suitable for monolithic integration. As demonstrated in various embodiments, increased sensitivity is made possible by narrowing the demodulation band on a low frequency side. According to the various embodiments, a monostable multivibrator or first pulse generator receives an input signal and provides an output having first and second states having a combined duration equal to one period of the input signal, or alternatively equal to one-half period of the input signal. A second pulse generator, responsive to the output of the first pulse generator, generates another output having third and fourth states whose combined duration is the same as the combined duration of the first and second states. Demodulation is accomplished finally through a low-pass filter, which integrates the output of the second pulse generator.

26 Claims, 5 Drawing Sheets

FIG. 4
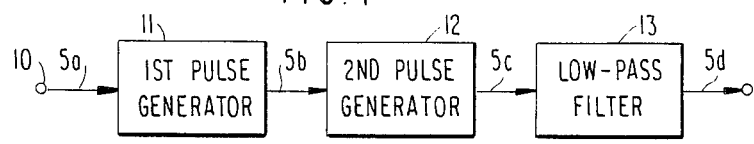
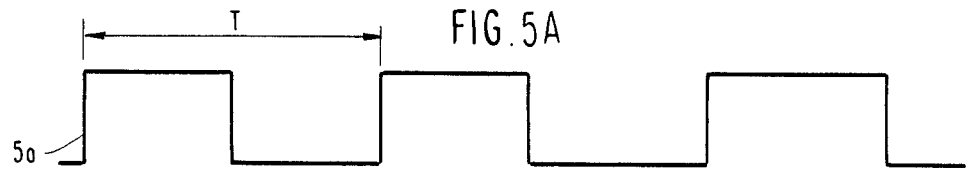
FIG. 5A
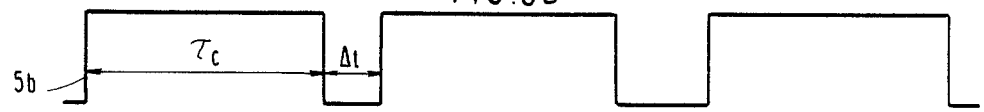
FIG. 5B
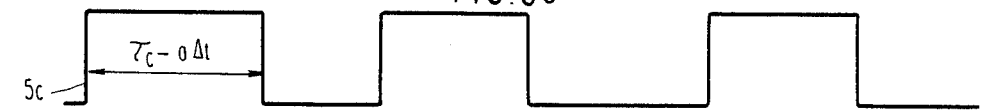
FIG. 5C
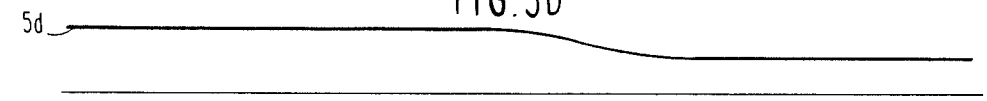
FIG. 5D
FIG. 6
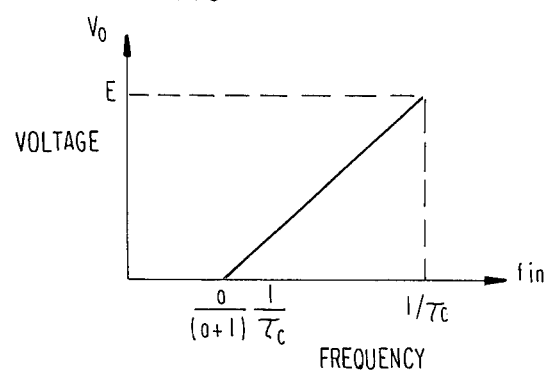

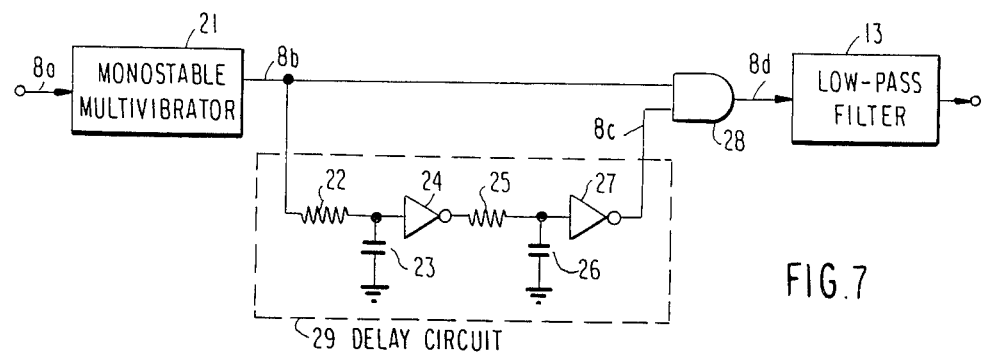
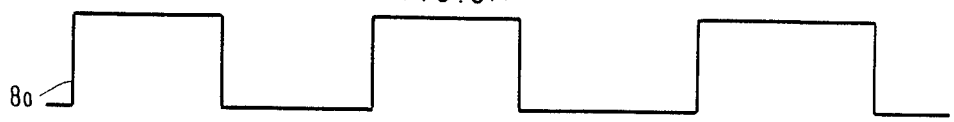
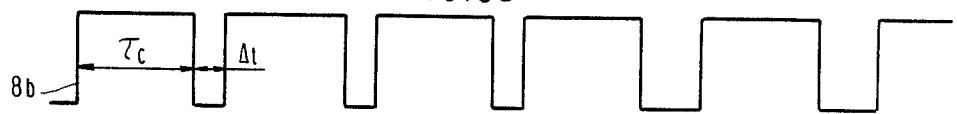
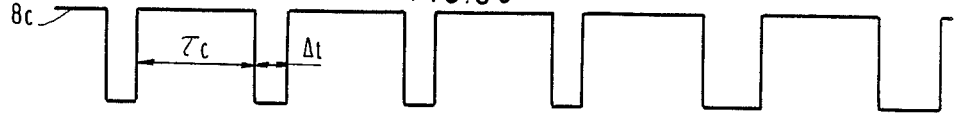
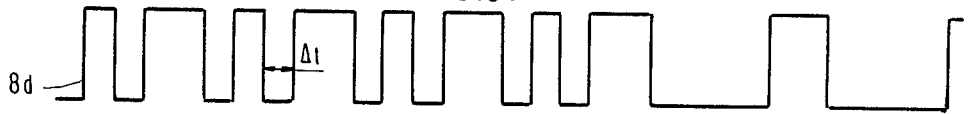
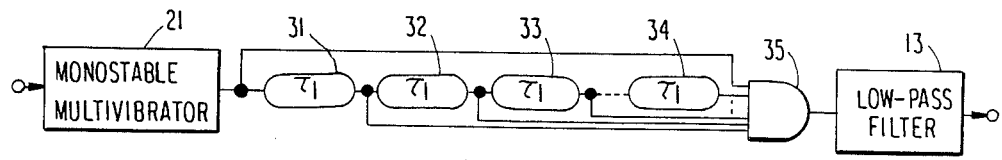

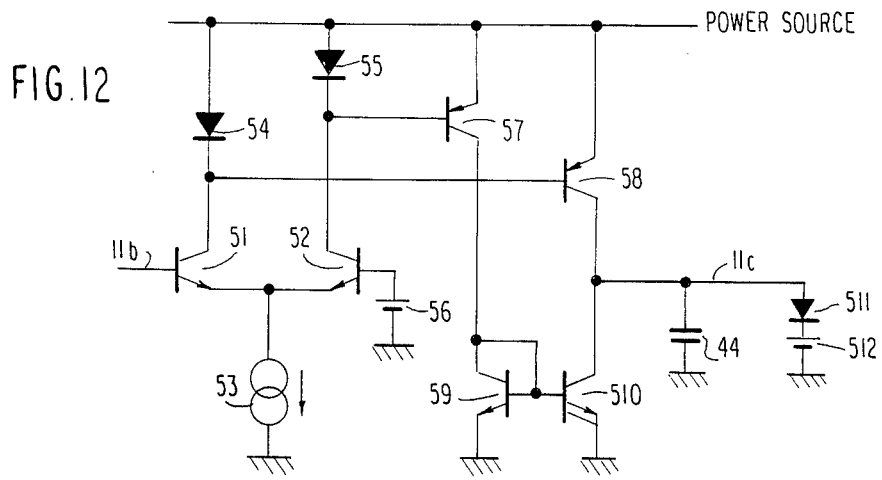
FIG. 12
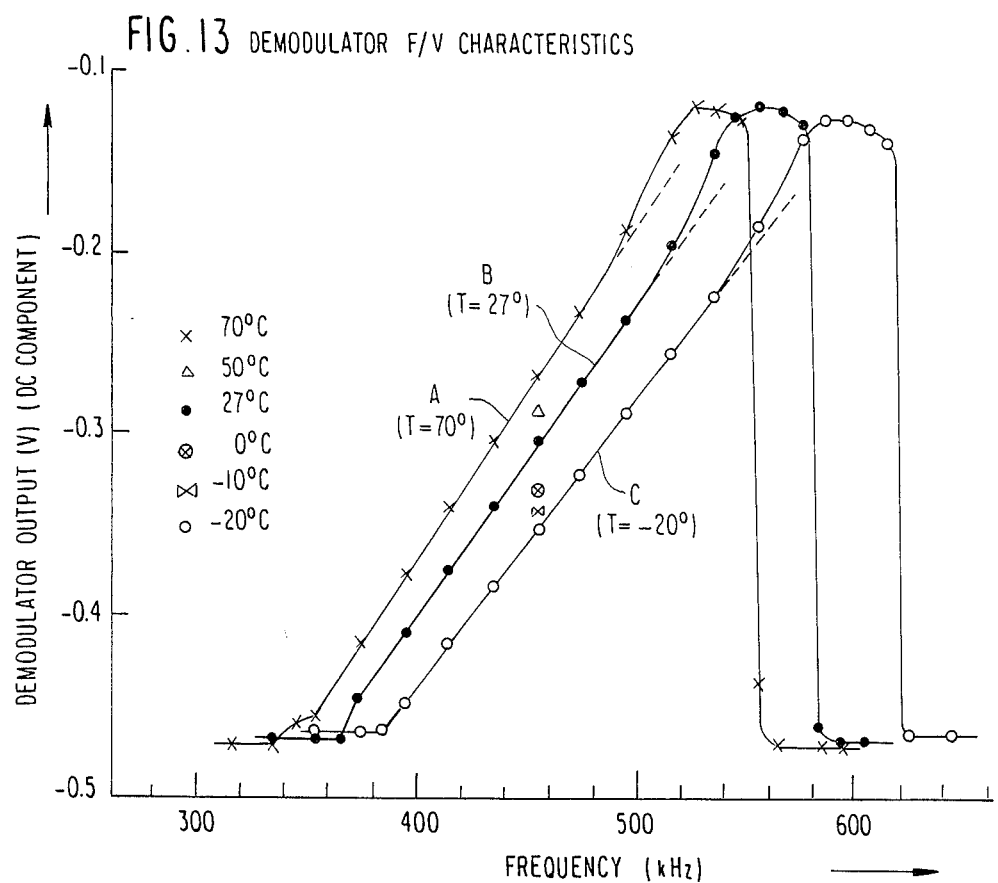
FIG. 13 DEMODULATOR F/V CHARACTERISTICS

PULSE COUNT TYPE FM DEMODULATOR

BACKGROUND OF THE INVENTION

The present invention relates to a frequency modulation (FM) demodulator and, more particularly, to a pulse count type FM demodulator.

A pulse count type demodulator of the prior art, as will be described in more detail later, usually consists of a limiter circuit, a monostable multivibrator and a low-pass filter (LPF). The monostable multivibrator generates a pulse having a fixed time width in response to a transition point, for instance the leading edge point, of the limiter circuit's output. The LPF integrates the output of the monostable multivibrator to supply a demodulated output. Since the width from the trailing edge of the monostable multivibrator's output to its next leading edge is proportional to the frequency of the input signal, the output voltage of the LPF is proportional to the frequency of the input signal, so that FM demodulation is achieved.

In the above described pulse count type demodulator of the prior art, the lower limit of the frequency band of demodulated signals is zero Hz (D.C.), and linearity is maintained over a wide band ranging from zero to the upper limit eetermined by the output pulse width of the monostable multivibrator. Though having such a wide frequency band, the prior art demodulator is poor in demodulation sensitivity. For this reason, where an FM signal whose maximum frequency deviation is extremely small relative to the center frequency, i.e., an FM signal whose normalized bandwidth is narrow, is to be demodulated, a demodulated signal is vulnerable to the adverse effect of external noise, such as source voltage fluctuation.

SUMMARY OF THE INVENTION

Therefore, an object of the present invention is to provide an FM demodulator having a higher demodulation sensitivity.

Another object of the invention is to provide an FM demodulator suitable for an FM signal having a narrow normalized bandwidth.

Still another object of the invention is to provide an FM demodulator suitable for monolithic integration.

According to the invention, there is provided a frequency modulation (FM) demodulator comprising: limiter means for converting an input signal into a rectangular signal; first pulse generator means responsive to the transition points of said rectangular signal for generating a first pulse train having first and second states for the period of said rectangular signal, said first state having a predetermined period of time; second pulse generator means for generating a second pulse train having third and fourth states for the period of said rectangular signal, the duration of said third state being reduced by a predetermined time length based on the duration of said second state of said first pulse train; and low-pass filter means for integrating said second pulse train to provide a demodulated signal.

BRIEF DESCRIPTION OF THE DRAWINGS

The above and other objects, features and advantages of the present invention will become more apparent from the detailed description hereunder taken in conjunction with the accompanying drawings, wherein:

FIG. 4 is a schematic block diagram illustrating a pulse count type FM demodulator according to a preferred embodiment of the invention;

FIGS. 5A to 5D are time charts for describing the operation of the demodulator of FIG. 4;

FIG. 6 is a diagram showing the F/V characteristic of the demodulator of FIG. 4;

FIG. 7 is a block diagram illustrating an FM demodulator according to another preferred embodiment of the invention;

FIGS. 8A to 8D are time charts for describing the operation of the demodulator of FIG. 7;

FIG. 9 is a block diagram illustrating an FM demodulator according to still another preferred embodiment of the invention;

FIG. 12 is a schematic circuit diagram of the principal part of the second pulse generator circuit of the FM demodulator of FIG. 10; and FIG. 13 is a graph illustrating simulated F/V characteristics of the FM demodulator of FIG. 10, obtained by the use of the simulation program of SPICE-F.

DETAILED DESCRIPTION OF THE PREFERRED EMBODIMENTS

To facilitate understanding of the present invention, a pulse count type FM demodulator of the prior art will be described first with reference to FIGS. 1, 2A to 2D and 3.

Figure 1:
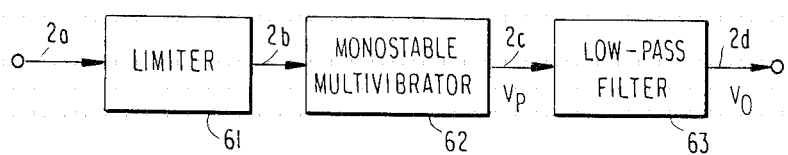
FIG. 1 is a block diagram illustrating a pulse count type FM demodulator of the prior art.
Figure 2A:
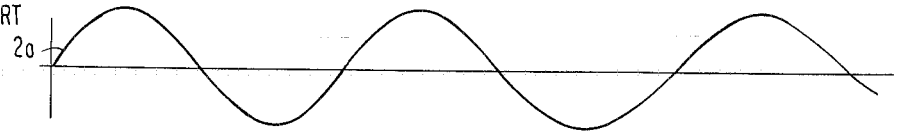
FIGS. 2A to 2D are time charts for describing the operation of the demodulator of FIG. 1.
Figure 2B:
Figure 2C:
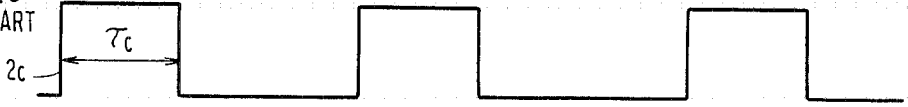
Figure 2D:

Referring to FIG. 1, the demodulator comprises a limiter 61, a monostable multivibrator 62 and a low-pass filter (LPF) 63. The limiter 61 amplitude-limits an input signal $2a$ to provide a rectangular signal $2b$ as shown in FIG. 2B. The monostable multivibrator 62 generates a pulse $2c$ (FIG. 2C) rising from a transition point of the rectangular signal $2b$ and having a fixed time duration ($\tau_c$), and supplies it to the LPF 63, which provides a demodulated output $2d$ (FIG. 2D) by integrating the pulse $2c$.

Thus, the demodulated output of the demodulator of FIG. 1 is calculated by Equation (1) below:

$$V_0 = \frac{1}{T} \int_p^T V_p(t) dt \quad (1)$$

where $V_0$ is the demodulated output;

T, the period of the input signal ($=1/f_{in}$);

$f_{in}$, the frequency of the input signal;

$$V_p(t), \text{ the output pulse train signal} = \begin{cases} E & (0 < t < \tau_c) \\ 0 & (\tau_c < t < T) \end{cases}$$

E, the amplitude of the output pulse.

Integrating Equation (1) gives Equation (2) below:

$$V_o = E\tau_c f_{in} \tag{2}$$

Figure 3:
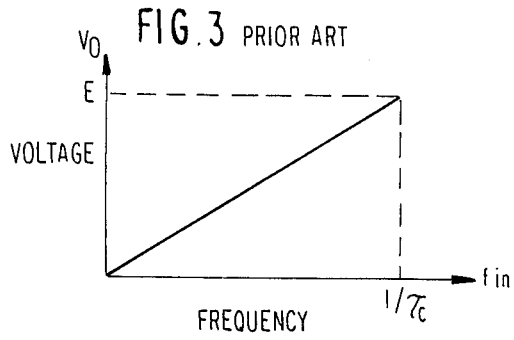
FIG. 3 is a diagram showing the frequency vs. voltage (F/V) characteristic of the demodulator of FIG. 1.

Equation (2) indicates that the demodulated output Vo is proportional to the input frequency $f_{in}$, and its demodulation (F/V) characteristic is shown in FIG. 3.

As may be apparent from the characteristic shown in FIG. 3, the lower limit of the demodulation band is zero Hz (D.C.), and linearity is maintained over a wide band ranging from zero to the upper limit determined by the pulse width $\tau_c$. This demodulation characteristic, however, has the disadvantages of low demodulation sensitivity and, where the normalized bandwidth of input FM signals is narrow, of vulnerability to external noise.

FIG. 4 illustrates a pulse count type FM demodulator, which is a preferred embodiment of the present invention. In FIG. 4, an input terminal 10 is supplied with a rectangular signal 5a (FIG. 5A), similar to the rectangular output from the limiter 61 shown in FIG. 1. A first pulse generator circuit 11, like the monostable multivibrator 62 of FIG. 1, generates a pulse 5b (FIG. 5B) having a fixed pulse width commencing at the leading edge of the rectangular signal 5a. The pulse interval $\Delta t$ of the pulse 5b of FIG. 5B is a function of the input frequency $f_{in}$. Thus holds the relationship of Equation (3) below:

$$\Delta t = T - \tau_c \tag{3}$$

A second pulse generator circuit 12, receiving the pulse 5b, narrows the pulse width $\tau_c$ of the pulse 5b only for a period of time proportional to its interval $\Delta t$ (the proportional constant being a, which is a positive real number), and thereby generates a pulse 5c having a pulse width of $\tau_c - a\Delta t$ as shown in FIG. 5C. An LPF 13 integrates the pulse train 5c to provide a demodulated output, which is represented by Equation (4) below, derived from Equation (1) above:

$$V_o = E\{(a+1)\tau_c f_{in} - a\} \tag{4}$$

The characteristic of Equation (4), as shown in FIG. 6, indicates a narrower demodulation band on the low frequency side and, correspondingly, an (a+1) times higher demodulation sensitivity than the F/V characteristic of the prior art illustrated in FIG. 3. Accordingly, even where the normalized bandwidth of an FM signal is narrow, the demodulator is hardly vulnerable to external noise.

FIG. 7 illustrates a pulse count type FM demodulator, which is another preferred embodiment of the present invention. In FIG. 7, a monostable multivibrator 21, serving as a first pulse generator circuit, generates pulses 8b (FIG. 8B) having a pulse width $\tau_c$ commencing at the leading and trailing edges of an input rectangular wave signal 8a to increase the demodulation sensitivity, and is so adjusted as to keep the $\Delta t$ smaller than $\tau_c$. The output pulse 8b of the monostable multivibrator 21 is divided into two branches, of which one is directly fed to one of the inputs of an AND gate 28 and the other, to the other input of the AND gate 28 through a delay circuit 29. The delay circuit 29 is comprised of a first integration circuit comprising a resistor 22 and a capacitor 23, a first inverter 24 to receive the integrated output, a second integration circuit which comprises a resistor 25 and a capacitor 26 and receives the output of the first inverter 24, and a second inverter 27 to receive the output of this second integration circuit. The delay time $\tau_1$ of the delay circuit 29 is set as represented by Inequality (5) below:

$$\Delta t_{max} < \tau_1 < \tau_c \tag{5}$$

where $\Delta t_{max}$ is the pulse interval of the pulse 8b when the input frequency is at its minimum.

The output 8d of the AND gate 28, as shown in FIG. 8D, has a pulse width smaller by $\Delta t$ than the output pulse 8b of the monostable multivibrator 21. Integrating the pulse 8d with the LPF 13 gives the F/V characteristic of a=1, in FIG. 6.

FIG. 9 illustrates an FM demodulator, which is still another preferred embodiment of the present invention. In FIG. 9, the output of a monostable multivibrator 21 is the same as that of the corresponding one in the embodiment of FIG. 7. Delay circuits 31 to 34 are connected in tandem, and the respective outputs of these delay circuits and of the monostable multivibrator 21 are applied to an AND gate 35. For the optimal design, it is recommended to set the values of the delay time $\tau_1$ of each of the delay circuits 31 to 34 and the number n of the delay circuits as represented by the following Equation-Inequality pair (6):

$$\left. \begin{array}{l} \tau_1 = \Delta t_{max} \\ n\tau_1 < \tau_c \end{array} \right\} \tag{6}$$

The modulation sensitivity of the modulator of FIG. 9, set as described above, is (n+1) times that of the conventional modulator of FIG. 1.

Figure 10:
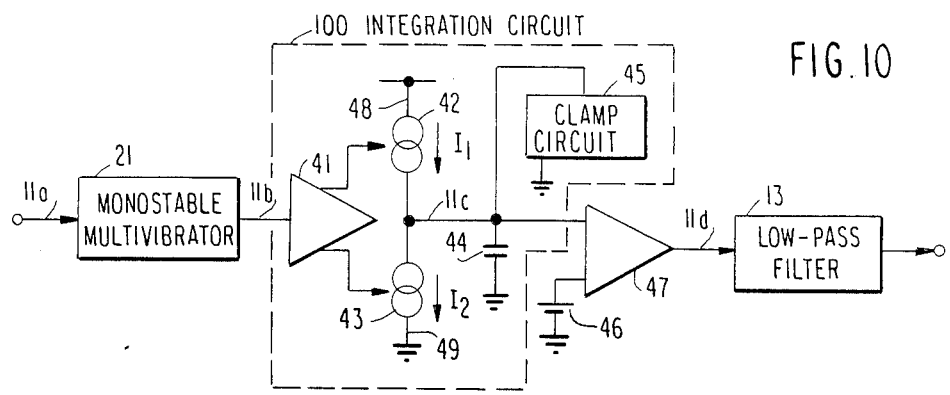
FIG. 10 is a block diagram illustrating an FM demodulator according to yet another preferred embodiment of the invention.

FIG. 10 illustrates an FM demodulator, which is yet another preferred embodiment of the present invention. In FIG. 10, the output of a monostable multivibrator 21 is the same as that of the corresponding one in the embodiment of FIG. 7. A switching circuit 41 is intended to turn on and off constant current sources 42 and 43. When an input signal 11b is at its "high" level, the switching circuit 41 keeps the constant current source 42 on while holding the constant current source 43 off and open, and vice versa when the input signal 11b is at its "low" level. Therefore, when the input 11b to the switching circuit 41 is "high", the constant current source 42 charges a capacitor 44 by a high-potential power source 48. Conversely, when the input 11b to the switching circuit 41 is "low", the constant current source 43 discharges the capacitor 44 to a low-potential power source 49 (a ground potential in this particular instance). The higher potential between the two electrodes of capacitor 44 is clamped at a fixed potential by a clamp circuit 45.

The relationship of Equation (7) below is to be maintained between the output current $I_1$ of the constant current source 42 and the output current $I_2$ of the constant current source 43.

$$I_2 = nI_1 \tag{7}$$

Figure 11A:
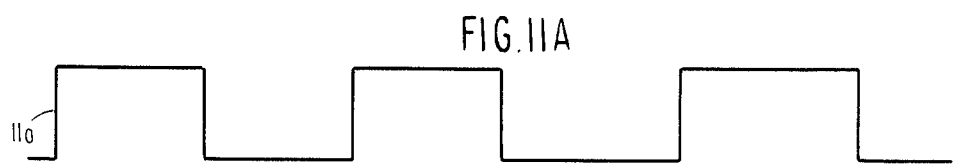
FIGS. 11A to 11D are time charts for describing the operation of the demodulator of FIG. 10.
Figure 11B:
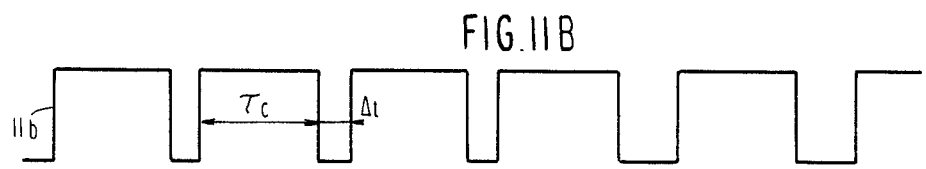
Figure 11C:
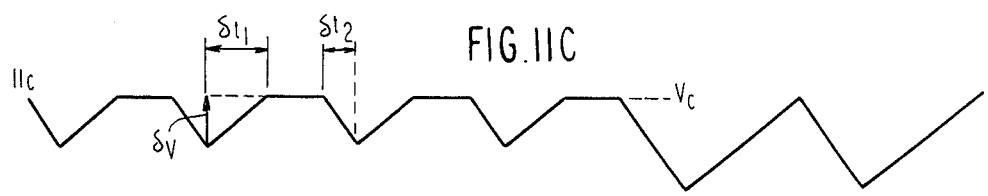

Since the capacitor 44 is charged and discharged by the constant currents $I_1$ and $I_2$, respectively, the inclinations of its charge and discharge waveforms, shown in FIG. 11C, are constant as represented by Equation (8) below:

$$\frac{dV}{dt} = \frac{I_1}{c} \text{ and } \frac{I_2}{c} \tag{8}$$

where c is the capacity of the capacitor 44.

If the upper limit of these charge and discharge waveforms is clamped at the clamp potential Vc of the clamp circuit 45, the potential variation $\delta V$ (FIG. 11C) during the period of discharge by the current $I_2$ will be represented by Equation (9) below:

$$\frac{\delta V}{\delta t_2} = \frac{I_2}{c} \quad (9)$$

where, as is evident from FIG. 11C, $\delta t_2$ equals $\Delta t$. Therefore, $\delta V$ is given by Equation (10) below:

$$\delta V = \frac{I_2}{c} \Delta t \quad (10)$$

Then, the time $\delta t_1$ required for returning the potential variation $\delta V$ to $V_c$ during the period of discharge by the current $I_1$ is calculated as follows:

$$\frac{\delta V}{\delta t_1} = \frac{I_1}{c} \quad (11)$$

According to Equations (10) and (12), Equation (13) can be developed as follows:

$$\begin{aligned} \delta t_1 &= \frac{c}{I_1} \cdot \frac{I_2}{c} \Delta t \\ &= \frac{I_2}{I_1} \Delta t \end{aligned} \quad (13)$$

According to Equation (7), Equation (13) can be converted into Equation (14) below:

$$\delta t_1 = n \Delta t \quad (14)$$

Figure 11D:
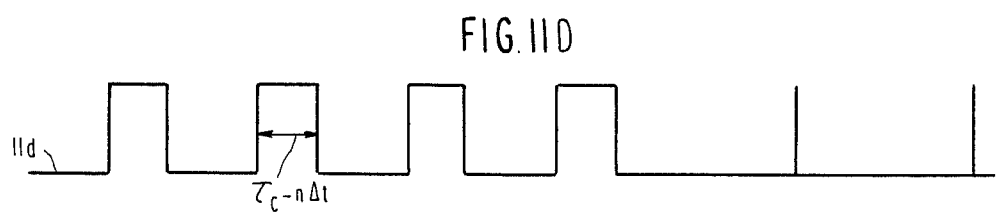

Therefore, by waveform-shaping the charge and discharge waveforms shown in FIG. 11C with a reference voltage obtained from a voltage source 46, which is slightly lower than the clamp voltage $V_c$, there is provided a pulse (FIG. 11D) having a width of $\tau_c - n\Delta t$. Thus, by varying the ratio n between the constant currents $I_1$ and $I_2$, the demodulation sensitivity can be changed. Integrating the pulse shown in FIG. 11D with the LPF 13 will provide the desired demodulation output.

FIG. 12 is a more specific circuit diagram of an integration circuit 100 of FIG. 10 which comprises the switching circuit 41, the constant current sources 42 and 43, and the clamp circuit 45. An input signal 11b is supplied to the base of a first transistor 51 whose emitter is connected to the emitter of a second transistor 52 and to a constant current circuit 53. The collector of the first transistor 51 is connected to the cathode of a first diode 54. The base of the second transistor 52 is grounded through a bias constant voltage source 56, and the collector of same is connected to the cathode of a second diode 55. The anodes of both the first and second diodes 54 and 55 are connected to a power source. Further, the collectors of the first and second transistors 51 and 52 are connected to the bases of third and fourth transistors 57 and 58, respectively, whose emitters are both connected to the power source and collectors are connected to those of fifth and sixth transistors 59 and 510, respectively.

The fifth transistor 59, with its collector and base being short-circuited, is used as a diode, and to their connecting point is further connected the base of the sixth transistor 510, the emitters of both the fifth and sixth transistors being grounded. Being so connected, the fifth and sixth transistors 59 and 510 serve as a current mirror circuit. Further, the emitter area of the sixth transistor 510 is made n times as great as that of the fifth transistor 59. The collector of the sixth transistor 510 serving as the output point is connected to a first terminal of the capacitor 44 whose second terminal is grounded. In parallel to the capacitor 44 is connected a series circuit of a third diode 511 and a reference voltage source 512.

The above described structure enables the capacitor 44 to be charged and discharged by switching the first and second transistors 51 and 52 with the input signal 11b and the ratio between the charging and discharging currents to be determined by that between the emitter areas of the fifth and sixth transistors 59 and 510. The third diode 511 and the reference voltage source 512 constitute the clamp circuit 45, whose clamp value is represented by $V_{ref} + V_r$, where $V_r$ represents the on-voltage of the diode 511 and $V_{ref}$, the voltage of the reference voltage source 512.

FIG. 13 shows the F/V characteristics, simulated by the simulation program of SPICE-F, of an FM demodulator circuit composed of the bipolar transistor circuit illustrated in FIGS. 10 and 12. The abscissa represents the frequency, and the ordinate, the D.C. component of the demodulated output. The characteristics were simulated with an intermediate frequency of 455 kHz, with temperature variations from $-20°$ to $+70°$ taken into consideration. As is evident from these simulated characteristics, a demodulation performance sufficiently close to linearity can be achieved in the temperature range of $-20°$ to $+70°$ and in the frequency (f) range of 390 kHz to 490 kHz. Incidentally, the ratio between the constant currents $I_1$ and $I_2$ is set at 1.75.

As hitherto described, an FM demodulator according to the present invention makes it possible to increase the demodulation sensitivity. This is achieved by adding a circuit which subjects the pulse width $\tau_c$ of a monostable multivibrator output to pulse width modulation by the pulse interval $\Delta t$ to alter the pulse width to $\tau_c - a\Delta t$. An FM demodulator according to the invention is especially suitable for monolithic integration of a demodulator circuit for use with input signals whose normalized bandwidth is comparatively narrow.

What is claimed is:

1. A frequency modulation (FM) demodulator comprising:
    limiter means for converting an input signal into a first signal having a rectangular waveform;
    first pulse generator means responsive to rising and falling edges of said first signal for generating a first pulse train having first and second states whose combined duration is equal to the period of said first signal, said first state having a first predetermined duration;
    second pulse generator means, responsive to said first pulse train, for generating a second pulse train having third and fourth states whose combined duration is equal to the period of said first signal, a duration of said third state being equal to said first predetermined duration reduced by a time length proportional to the duration of said second state of said first pulse train; and low-pass filter means for integrating said second pulse train to provide a demodulated signal.

2. An FM demodulator as claimed in claim 1, wherein said first pulse generator means comprises a monostable multivibrator.

3. An FM demodulator as claimed in claim 1, wherein said second pulse generator means comprises a delay circuit which receives said first pulse train and transmits said first pulse train with a predetermined delay to provide a delayed pulse train; and an AND gate which receives said first pulse train and said delayed pulse train to provide an output as the output of said second pulse generator means.

4. An FM demodulator as claimed in claim 3, wherein said delay circuit comprises a pair of series circuits of an integration circuit and an inverter, each of said integration circuits comprising a resistor and a capacitor.

5. An FM demodulator as claimed in claim 1, wherein said second pulse generator means comprises a plurality of delay circuits for successively giving prescribed delays to said first pulse train and an AND gate for logically combining said first pulse train and respective outputs of said plurality of delay circuits to provide and output as the output of said second pulse generator means.

6. An FM demodulator as claimed in claim 5, wherein all of said prescribed delays by said plurality of delay circuits are equal to each other.

7. An FM demodulator as claimed in claim 1, wherein said second pulse generator means comprises an integration circuit for receiving said first pulse train and integrating it by different time constants at the leading and trailing edges of said first pulse train, respectively; and a comparator for converting the output of said integration circuit into a rectangular signal.

8. An FM demodulator as claimed in claim 7, wherein said integration circuit comprises first and second constant current sources for supplying first and second currents, respectively; a switching circuit responsive to the rise of said first pulse train for turning said first constant current source on and said second constant current source off, and responsive to the fall of said first pulse train for turning said first constant current source off and said second constant current source on; a capacitor coupled to said first and second constant current sources, charged by said first current from said first constant current source, and discharged by said second current from said second constant current source; and a clamp circuit for clamping a voltage between the terminals of said capacitor at a prescribed level.

9. An FM demodulator as claimed in claim 8, wherein a ratio between said first and second currents is n, n being a positive real number.

10. An FM demodulator as claimed in claim 9, wherein said switching circuit comprises a differential amplifier whose input terminals receive said first pulse train and which is comprised of first and second transistors, and wherein said first and second constant current sources comprise third and fourth transistors whose bases are connected to the respective collectors of said first and second transistors; and a current mirror circuit including fifth and sixth transistors which are respectively coupled to said third and fourth transistors and whose emitter areas are in the ratio of n, a collector of said sixth transistor being coupled to said capacitor.

11. An FM demodulator as claimed in claim 8, wherein said clamp circuit comprises a diode.

12. An FM demodulator comprising:

first pulse generator means for generating a first pulse train having first and second levels, changing from said first level to said second level in response to rising and falling edges of an input signal and changing from said second level to said first level after a predetermined period of time;

second pulse generator means for generating a second pulse train by subjecting each of said second levels of said first pulse train to pulse width modulation by a function related to the duration of an adjacent one of said first levels of said first pulse train; and converting means for converting said second pulse train into a D.C. voltage.

13. An FM demodulator as claimed in claim 12, wherein said first pulse generator means comprises a monostable multivibrator for generating pulses having a prescribed pulse width and rising in response to said rising and falling edges of said input signal and providing said first pulse train, and wherein said second pulse generator means comprises a delay circuit for delaying said first pulse train by a prescribed time length, and an AND gate for ANDing said first pulse train and the output of said delay circuit to provide said second pulse train, and wherein said converting means comprises a lowpass filter for low-pass filtering said second pulse train.

14. An FM demodulator as claimed in claim 12, wherein said first pulse generator means comprises a monstable multivibrator for generating pulses having a prescribed width and rising in response to said rising and falling edges of said input signal and providing said first pulse train, and wherein said second pulse generator means comprises a plurality of delay circuits for providing successive prescribed delays to said first pulse train and an AND gate for ANDing said first pulse train and respective outputs of said plurality of delay circuits to provide said second pulse train, and wherein said converting means comprises a low-pass filter for low-pass filtering said second pulse train.

15. An FM demodulator as claimed in claim 12, wherein said first pulse generator means comprises a monostable multivibrator for generating pulses having a prescribed width and rising in response to said rising and falling edges of said input signal and providing said first pulse train, and wherein said second pulse generator means comprises a capacitor, a charge and discharge circuit responsive to said first pulse train for charging and discharging said capacitor by different time constants at the leading and trailing edges of said first pulse train, respectively, and a comparator for converting the output of said charge and discharge circuit into a signal having a rectangular waveform to provide said second pulse train, and wherein said converting means comprises a low-pass filter for low-pass filtering said second pulse train.

16. An FM demodulator as claimed in claim 15, wherein said charge and discharge circuit comprises first and second constant current sources for supplying first and second currents, respectively; a switching circuit responsive to the transition points of said first pulse train for alternately turning on and off said first and second constant current sources, said capacitor being coupled to said first and second constant current sources; and being charged and discharged by said first and second constant currents; and a clamp circuit for clamping a voltage between the terminals of said capacitor at a prescribed level.

17. An FM demodulator as claimed in claim 12, further comprising limiter means for converting said input signal into a rectangular signal and supplying it to said first pulse generator means.

18. A method of demodulating and FM signal, comprising the steps of:
   in response to rising and falling edges of said FM signal, generating a first pulse train having first and second states whose combined duration is equal to one period of said FM signal, said first state having a predetermined duration;
   generating a second pulse train by subjecting each of said states of said first pulse train to pulse-width modulation by a function related to the duration of an adjacent one of said second states of said first pulse train; and
   converting said second pulse train into a D.C. voltage.

19. A method as claimed in claim 18, further comprising the step of amplitude limiting said FM signal.

20. A method as claimed in claim 19, wherein said step of generating said first pulse train comprises the step of generating, as said first pulse train, pulses that rise at the leading and trailing edges of the amplitude-limited FM signal, and wherein said step of generating said second pulse train comprises the steps of:
   delaying said first pulse train by a predetermined t length;
   generating said pulse train by taking the logical product of said first pulse train and the delayed first pulse train,
   and wherein said converting step comprises the step of low-pass filtering said second pulse train.

21. A method as claimed in claim 19, wherein said step of generating said first pulse train comprises the step of generating, as said first pulse train, pulses that rise at the leading and trailing edges of the amplitude-limited FM signal, and wherein said step of generating said second pulse train comprises the steps of:
   delaying said first pulse train;
   repeating said delaying step a plurality of times; and
   logically combining said first pulse train and results of said delaying steps,
   and wherein said converting step comprises the step of low-pass filtering said second pulse train.

22. A method as claimed in claim 19, wherein said step of generating said first pulse train comprises the step of generating, as said first train, pulses that rise at the leading and trailing edges of the amplitude-limited FM signal, and wherein said step of generating said second pulse train comprises the steps of:
   supplying a capacitor with first and second constant currents in response to rising and falling edges, respectively, of said first pulse train;
   clamping the upper limit of the voltage charged at said capacitor at a prescribed level; and
   comparing a voltage between the two terminals of said capacitor and a reference voltage, which is slightly lower than said prescribed level, to generate said second pulse train, and wherein said converting step comprises the step of low-pass filtering said second pulse train.

23. An FM demodulator circuit comprising:
   a first pulse generator circuit for converting an input signal into a first signal having first and second states having combined durations equal to at least one period (T) of said input signal, said first state having a fixed time width ($\tau_c$);
   a second pulse generator circuit for pulse-width modulating each of said first states of said first signal with a function related to the duration ($\Delta t$) of an adjacent one of said second states of said first signal to provide a second signal having a third state whose duration is $\tau_c - a\Delta t$ (a is a positive real number); and
   an integration circuit for integrating said second signal from said second pulse generator circuit to provide an FM demodulated signal.

24. An FM demodulator circuit as claimed in claim 23, wherein said second pulse generator circuit comprises a delay circut for delaying the output of said first, pulse generator circuit, and an AND circuit receiving and logically combining the outputs of said first pulse generator circuit and said delay circuit.

25. An FM demodulator circuit as claimed in claim 23, wherein said second pulse generator circuit comprises a plurality of delay circuits for delaying the output of said first pulse generator circuit, each of said delay circuits having a different delay length, and an AND circuit receiving and logically combining the respective outputs of said delay circuits and the output of said first pulse generator circuit.

26. An FM demodulator circuit as claimed in claim 23, wherein said second pulse generator circuit comprises an integration circuit responsive to the output of said first pulse generator cirouit and having different rising and falling time constants, and a comparator responsive to the output of said integration circuit for regenerating a rectangular signal.

* * * * *

UNITED STATES PATENT AND TRADEMARK OFFICE
CERTIFICATE OF CORRECTION

PATENT NO. : 4,800,338

DATED : January 24, 1989

INVENTOR(S) : Shigeo YOSHIZAWA

It is certified that error appears in the above-identified patent and that said Letters Patent is hereby corrected as shown below:

COLUMN 1, LINE 27  Delete "eetermined" and insert --determined--.

COLUMN 5, LINE 24  Insert
--From Equation (11), $\delta t_1 = \frac{C}{I_1} \cdot \delta V \quad \dots \quad (12)$--.

COLUMN 9, LINE 28  Delete "t" and insert --time--.

COLUMN 10, LINE 32  Delete "circut" and insert --circuit--.

COLUMN 10, LINE 47  Delete "cirouit" and insert --circuit--.

Signed and Sealed this

Eighth Day of August, 1989

Attest:

DONALD J. QUIGG

Attesting Officer

Commissioner of Patents and Trademarks